US008848378B2

(12) United States Patent
Liao

(10) Patent No.: US 8,848,378 B2
(45) Date of Patent: Sep. 30, 2014

(54) SECURING STRUCTURE FOR MOUNTING SERVER TO SERVER CABINET

(75) Inventor: Feng-Liang Liao, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 273 days.

(21) Appl. No.: 13/451,442

(22) Filed: Apr. 19, 2012

(65) Prior Publication Data
US 2013/0163167 A1 Jun. 27, 2013

(30) Foreign Application Priority Data

Dec. 27, 2011 (TW) .................................. 100224763

(51) Int. Cl.
G06F 1/16 (2006.01)
G06F 1/18 (2006.01)
(52) U.S. Cl.
CPC ...................................... G06F 1/181 (2013.01)
USPC .................... 361/727; 248/231.41; 248/224.8
(58) Field of Classification Search
CPC ....... H05K 7/1489; G06F 1/181; G06F 1/184; G06F 1/183; G06F 1/187; G11B 33/128
USPC ............................ 361/727; 248/231.41, 224.8
See application file for complete search history.

(56) References Cited

U.S. PATENT DOCUMENTS

| 8,437,123 | B2 * | 5/2013 | Sun | 361/679.02 |
|---|---|---|---|---|
| 8,605,442 | B2 * | 12/2013 | Wu et al. | 361/727 |
| 2002/0093795 | A1 * | 7/2002 | Gough et al. | 361/727 |
| 2004/0129657 | A1 * | 7/2004 | Dean et al. | 211/26 |
| 2006/0164802 | A1 * | 7/2006 | Chen | 361/683 |
| 2009/0219701 | A1 * | 9/2009 | Wu et al. | 361/727 |
| 2010/0014231 | A1 * | 1/2010 | Zhang | 361/679.02 |
| 2012/0145874 | A1 * | 6/2012 | Eberle et al. | 248/636 |
| 2013/0044416 | A1 * | 2/2013 | Fan | 361/679.01 |
| 2013/0048581 | A1 * | 2/2013 | Kuo | 211/26 |
| 2013/0162131 | A1 * | 6/2013 | Zhou | 312/304 |

* cited by examiner

Primary Examiner — Lisa Lea Edmonds
(74) Attorney, Agent, or Firm — Novak Druce Connolly Bove + Quigg LLP

(57) ABSTRACT

A securing structure used to mount a server including a housing to a server cabinet includes a sliding member and a fixing member. The sliding member includes a sliding portion, a receiving portion, and a fixing portion configured between the sliding portion and the receiving portion. The sliding portion extends into the housing and is slidably connected to a sidewall of the housing. The receiving portion is used to receive at least one cable connected to the server. The fixing member is securely connected between the fixing portion and the server cabinet.

20 Claims, 10 Drawing Sheets

SECURING STRUCTURE FOR MOUNTING SERVER TO SERVER CABINET

BACKGROUND

1. Technical Field

The present disclosure generally relates to securing structures used in server cabinets, and more particularly to a securing structure for mounting a server to a server cabinet.

2. Description of Related Art

Computer server systems include multiple servers mounted in a server cabinet. Each server includes many electronic components, such as one or more processors, RAMs, fixed disks, AC to DC power supplies, and the like. Therefore, each server includes a plurality of input/output (I/O) ports providing for a plurality of connecting cables. However, there is a lack of any structures disposed in the computer server systems of related art for tidying up the plurality of cables.

Therefore, a need exists to overcome the above-described limitations and extend the functionality.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the views.

DETAILED DESCRIPTION

Figure 1:
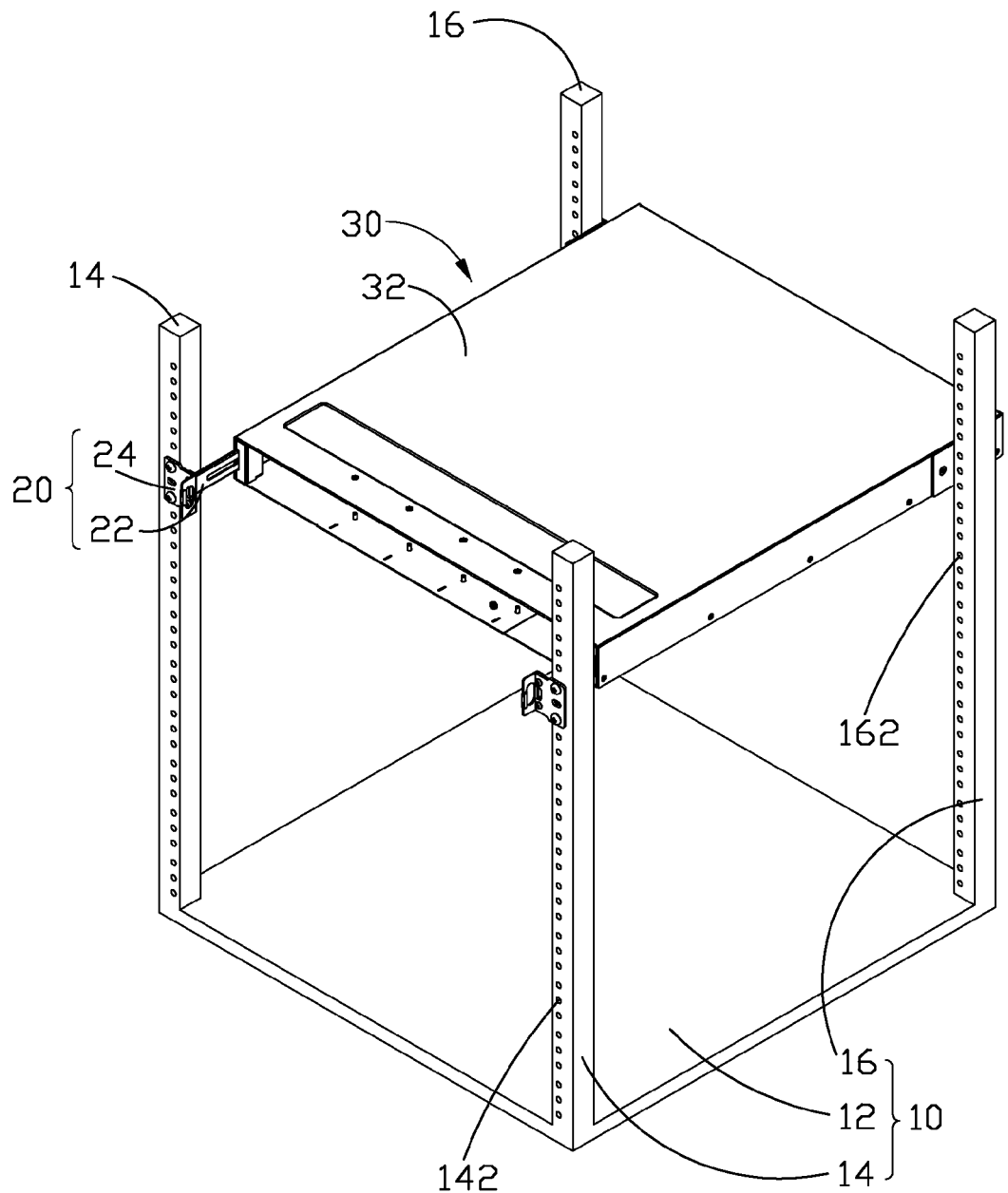
FIG. 1 is a schematic view of an exemplary embodiment of a securing structure for fixing a server to a server cabinet.

The embodiments described herein are illustrated by way of example and not by way of limitation in the figures of the accompanying drawings, in which like reference numerals indicate the same or similar elements. References to "an" or "one" embodiment in this disclosure are not necessarily to the same embodiment, and such references can mean "at least one."

Figure 2:
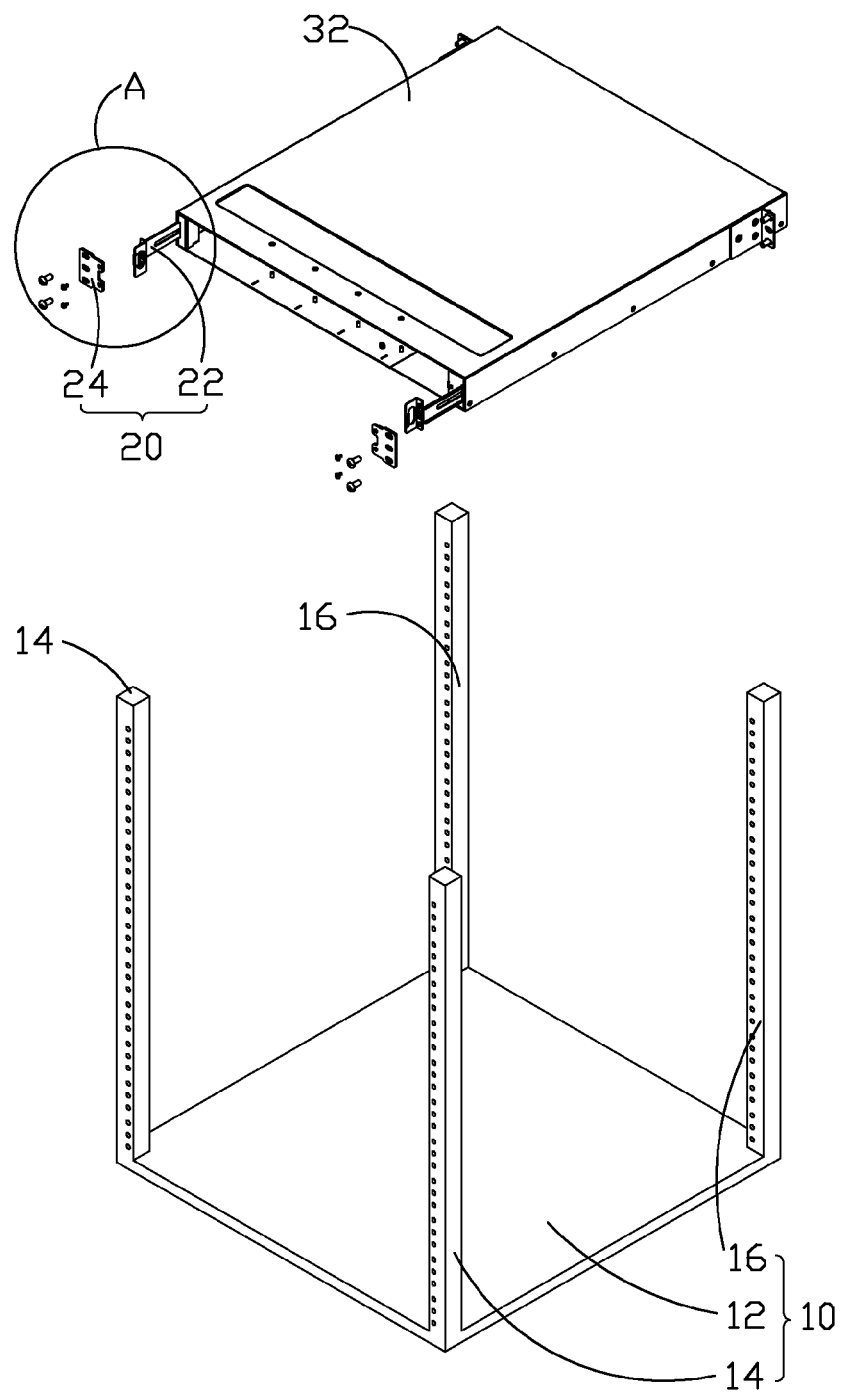
FIG. 2 is a disassembled schematic view of the securing structure of FIG. 1.

Referring to FIGS. 1-2, a securing structure 20 is used to mount a server 30 to a server cabinet 10. In one embodiment, the server 30 may be a switch or a router, for example. The server 30 comprises a housing 32, in which many electronic components, such as one or more processors, RAM elements, fixed disks, AC to DC power supplies, and the like, are mounted. The server cabinet 10 comprises a bottom board 12, a pair of first supporting posts 14 and a pair of second supporting posts 16. The first and second supporting posts 14, 16 perpendicularly extend up from the bottom board 12. In this embodiment, the bottom board 12 is configured as a square, and the first and second supporting posts 14, 16 are located at four corners of the bottom board 12. Each of the first supporting posts 14 defines a plurality of screw holes 142. Each of the second supporting posts 16 defines a plurality of screw holes 162. Two sides of one end, as a back-end, of the server 30 are respectively fixed to the pair of first supporting posts 14 by two securing structures 20, and two sides of the other end, as a front-end, of the server 30 are fixed to the pair of second supporting posts 16 by angle iron engaging with screws.

Figure 3:
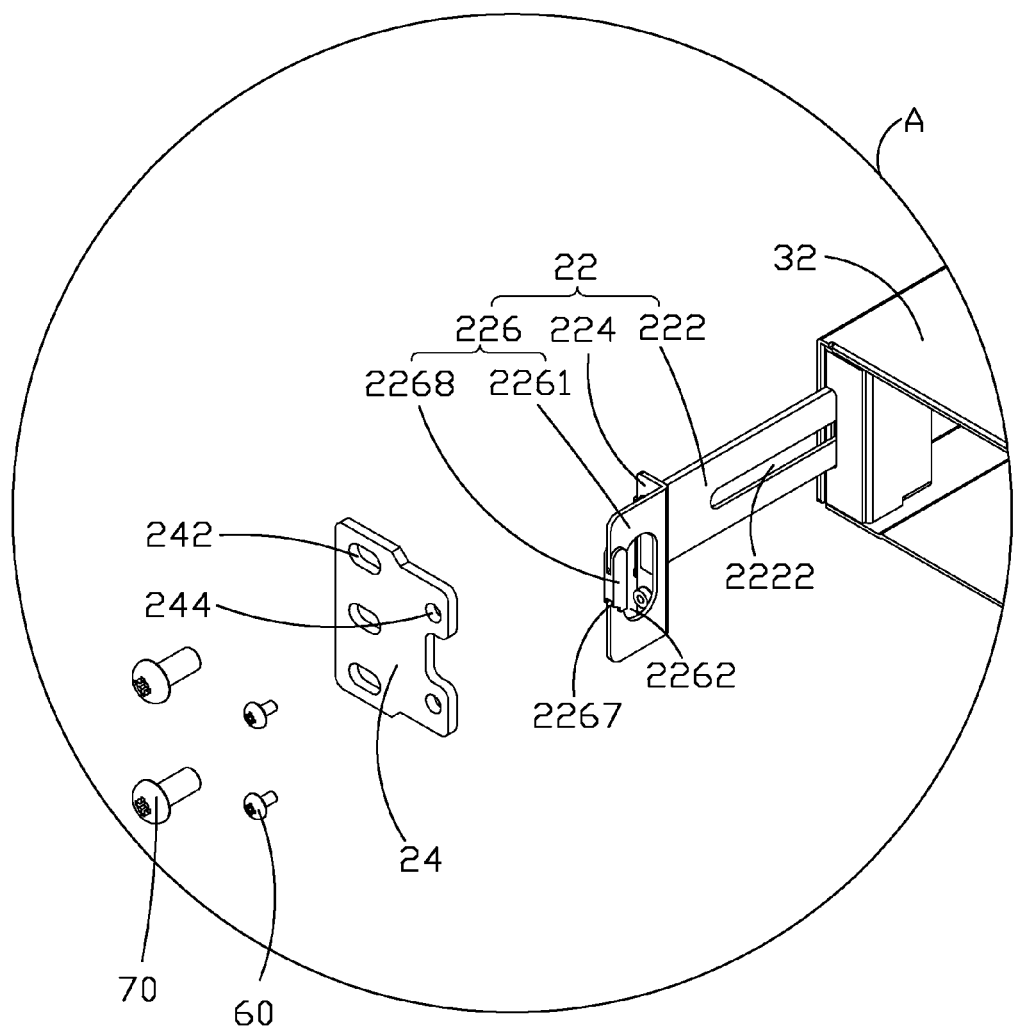
FIG. 3 is an enlarged view of an area labeled A in FIG. 2.
Figure 4:
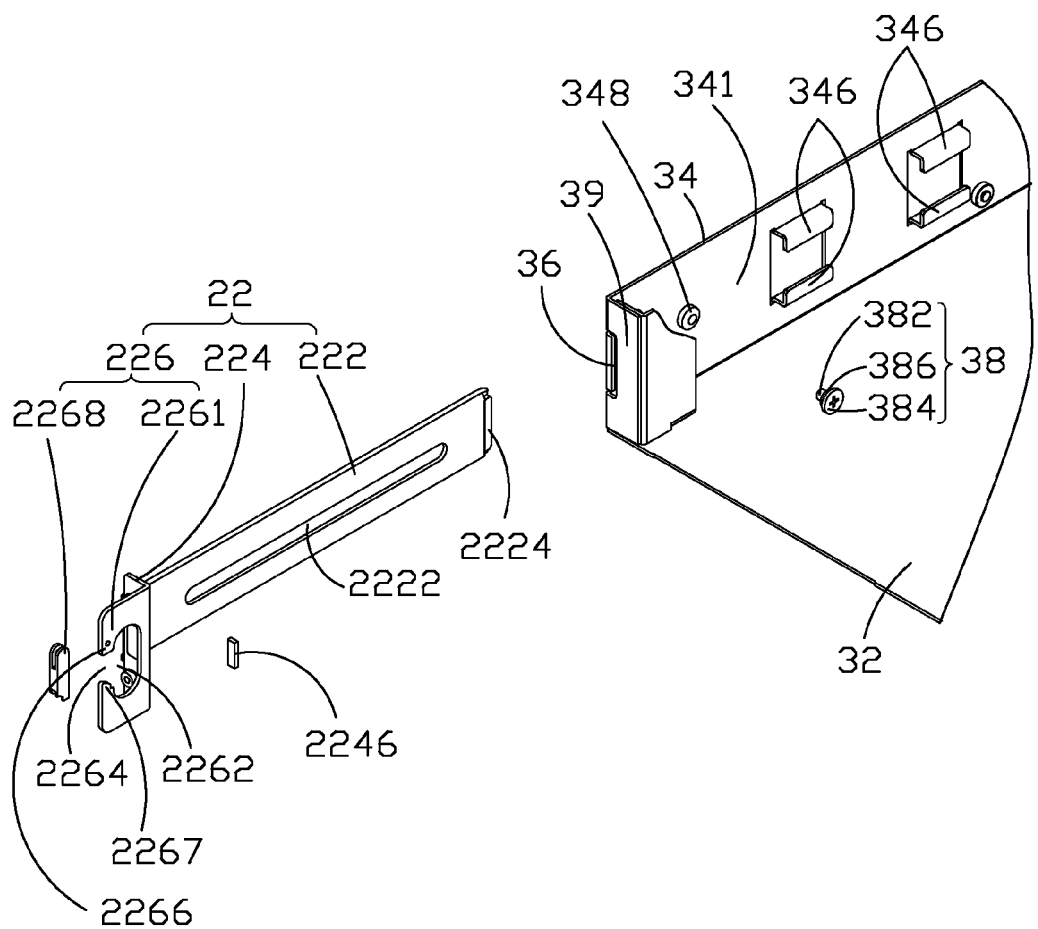
FIG. 4 is a disassembled schematic view of a sliding member of the securing structure and part of the server engaging with the sliding member.
Figure 9:
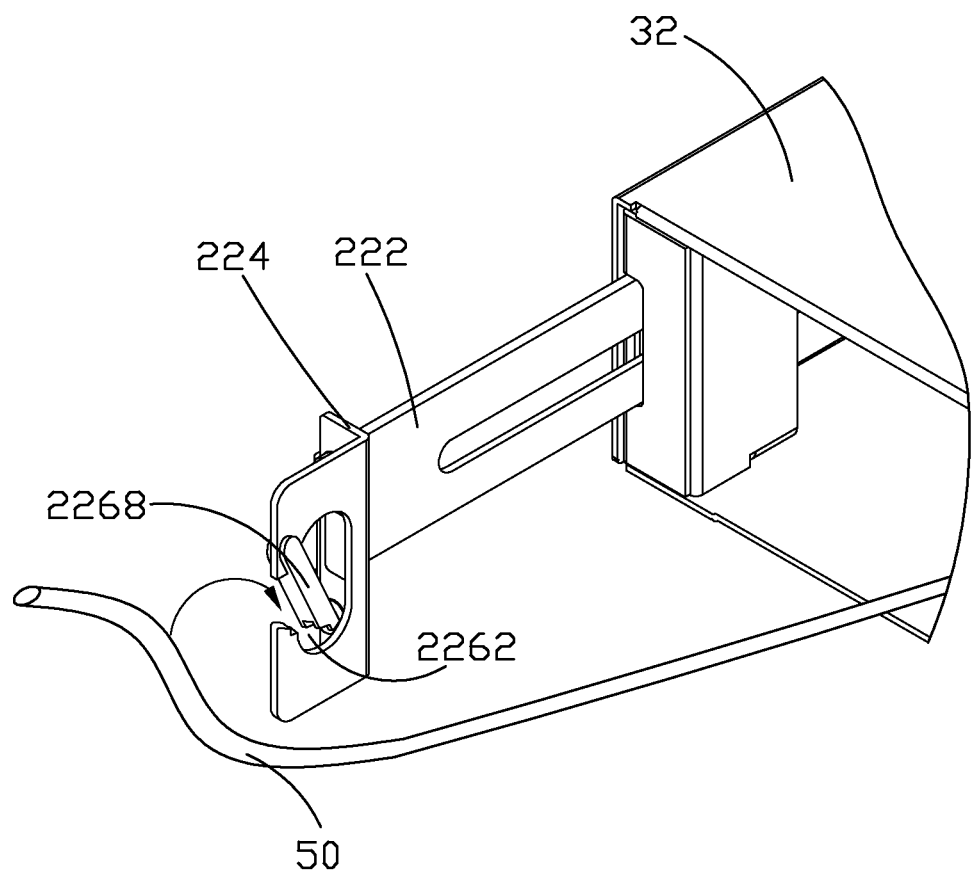
FIG. 9 is a schematic view showing a method and a process of mounting a cable to the securing structure.
Figure 10:
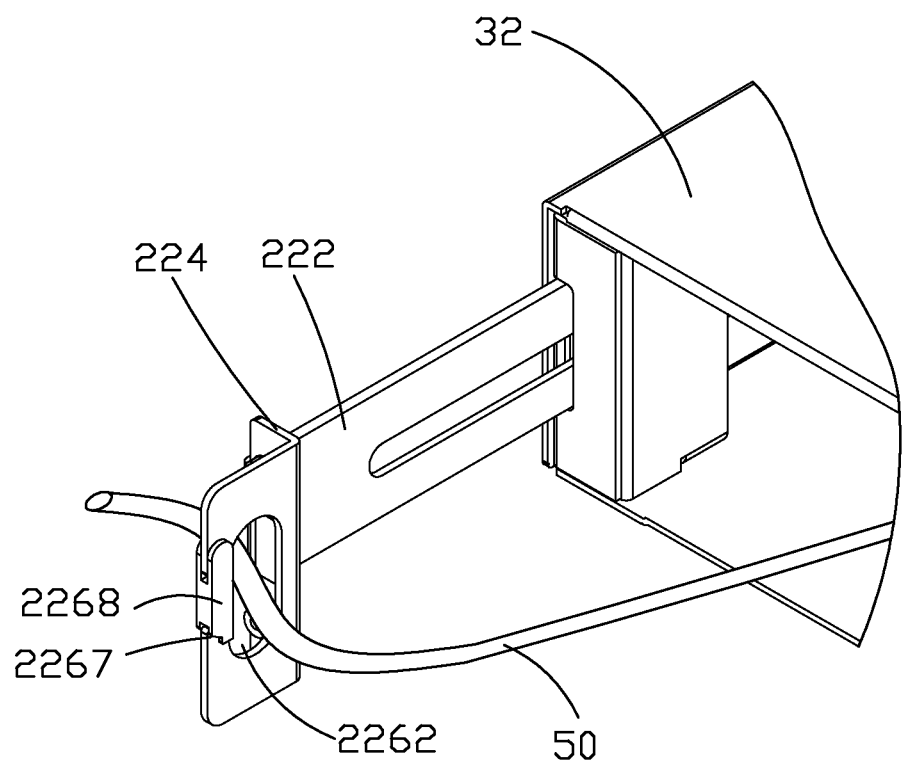
FIG. 10 is a schematic view showing the cable of FIG. 9 being received in the securing structure.

Referring to FIGS. 3-4, the securing structure 20 comprises a sliding member 22 slidably connected to the housing 32 and a fixing member 24 fixed between the sliding member 22 and the first supporting post 14 of the server cabinet 10. The sliding member 22 comprises a sliding portion 222, a receiving portion 226, and a fixing portion 224 configured between the sliding portion 222 and the receiving portion 226. The sliding portion 222 extends into the housing 32 and is slidably connected to a sidewall 34 of the housing 32. The receiving portion 226 can receive at least one cable 50 connected to the server 30, shown in FIGS. 9-10. The fixing member 24 is securely connected between the fixing portion 224 and the first supporting post 14 of the server cabinet 10.

When the server 30 is required to be fixed to the server cabinet 10, two sides of the front-end of the server 30 are fixed to the pair of second supporting posts 16, then two sliding members 22 of the two securing structures 20 connected to the back-end of the server 30 are adjusted to make two fixing members 24 respectively engage with the pair of first supporting posts 14, so the server 30 is ultimately secured to the server cabinet 10. The server 30 can be employed to many different types of server cabinets 10 with different sizes via sliding the sliding member 22 of the securing structure 20 relative to the housing 32 of the server 30.

Figure 5:
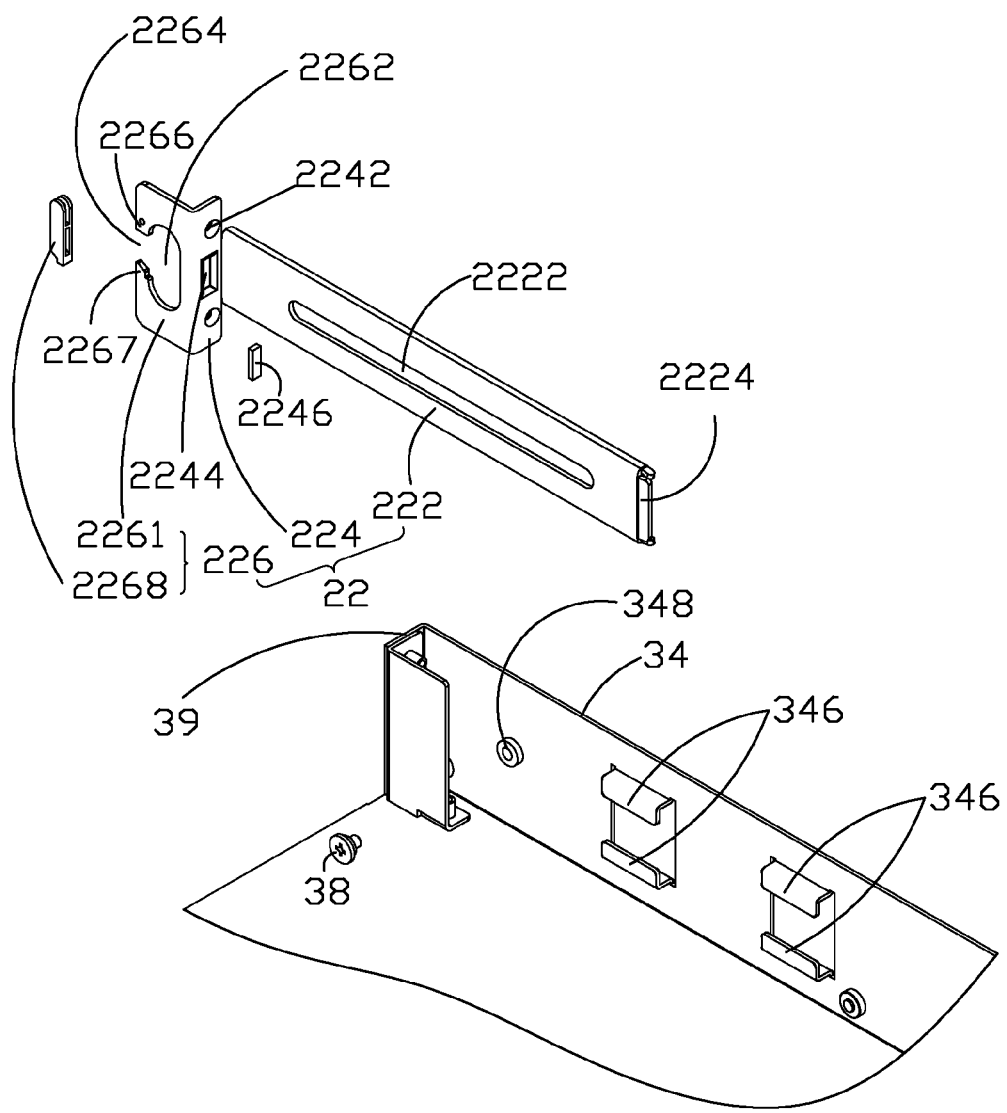
FIG. 5 is similar to FIG. 4, showing from another direction.

In this embodiment, the fixing member 24 defines three first fixing holes 242 and two second fixing holes 244 respectively arranged in rows and close to two opposite edges of the fixing member 24. The fixing member 24 is fixed to the first supporting post 14 via one or more screws 70 passing through the first fixing holes 242 and screwed into the corresponding screw holes 142. Similarly, the fixing member 24 is fixed to the fixing portion 224 via one or more screws 60 passing through the second fixing holes 244 and screwed into the fixing portion 224. Referring to FIG. 5, the fixing portion 224 defines two screw holes 2242 matching with two screws 60 to be secured to the fixing member 24.

Figure 6:
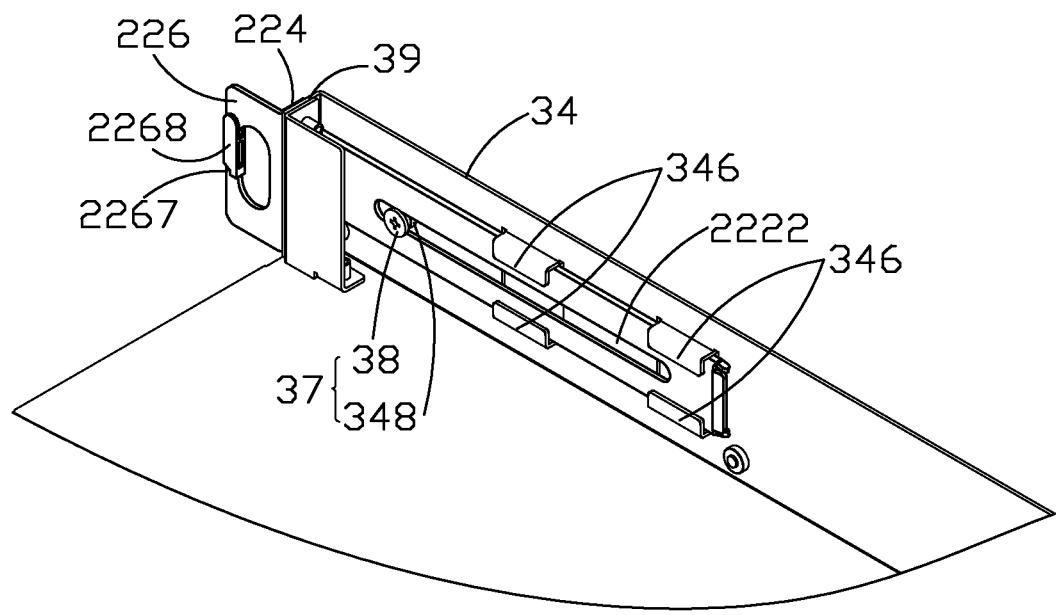
FIG. 6 is an assembled view of the items in FIG. 5.

Referring to FIGS. 5-6, the housing 32 defines a through hole 36 formed at one end of the sidewall 34 and used to provide an entrance for the sliding portion 222 being inserted into the housing 32. The sidewall 34 comprises a guiding portion 346 and a positioning portion 37, both protruding from an inner surface 341 of the sidewall 34. The positioning portion 37 is configured between the guiding portion 346 and the through hole 36, and comprises a fixing post 348 protruding inwardly from an inner surface 341 of the sidewall 34 and a screw 38 matching with the fixing post 348, to position the sliding portion 222 to the sidewall 34. The screw 38 comprises a post portion 382, a head portion 384 and a step portion 386 configured between the head portion 384 and the post portion 382.

The sliding portion 222 of the sliding member 22 defines a sliding groove 2222. The sliding portion 222 matches with the guiding portion 346. That is, the guiding portion 346 provides a sliding track for the sliding portion 222. The sliding groove 2222 matches with the positioning portion 37 to limit the travel of the sliding portion 222. Therefore, the sliding portion 222 is slidably positioned to the sidewall 34 and can slide in the guiding portion 346 along the sliding groove 2222.

In assembly, the post portion 382 passes through the sliding groove 2222 and is screwed into the fixing post 348, the step portion 386 is received in the sliding groove 2222, and the head portion 384 is secured on an opposite side of the sliding portion 222 away from the sidewall 34. That is, the sliding portion 222 is limited between the head portion 384 and the sidewall 34, shown in FIG. 6.

In this embodiment, the sliding portion 222 comprises an inclined portion 2224 configured on a free end of the sliding portion 222 away from the fixing portion 224. The inclined portion 2224 has a smaller size relative to the through hole 36, thereby providing an easy installation for the securing structure 20 and the housing 32.

Figure 7:
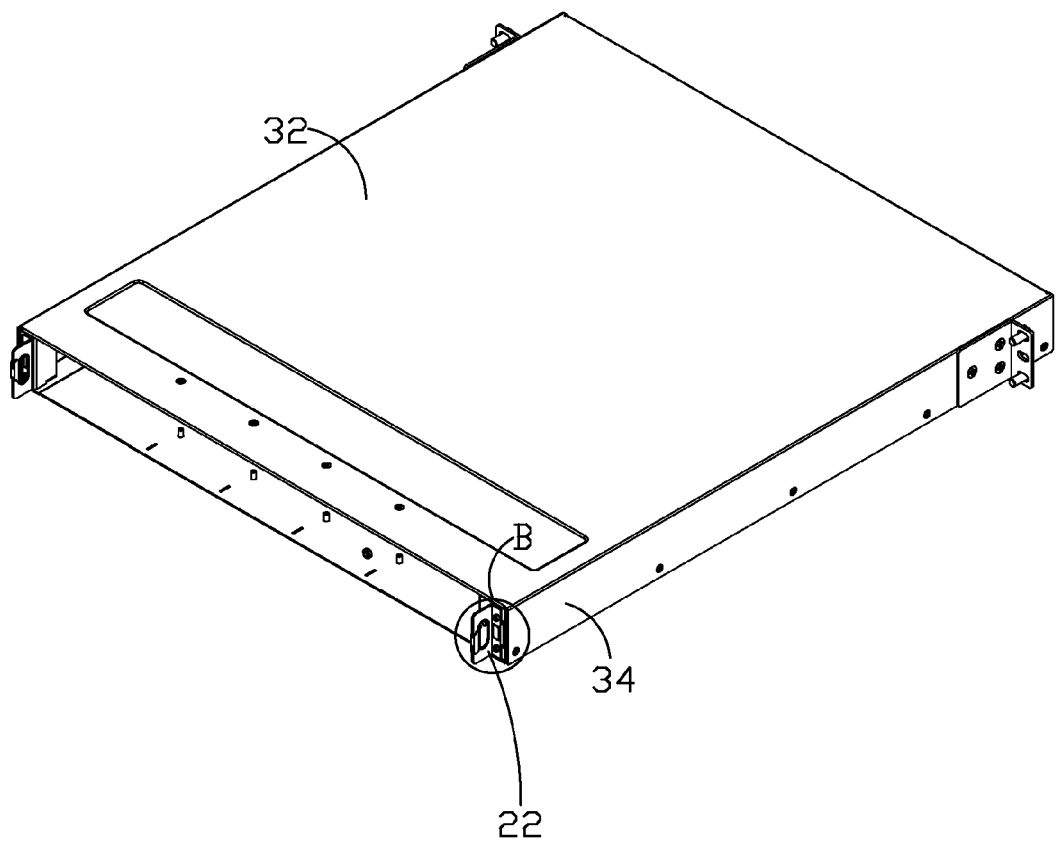
FIG. 7 is an assembled view of the sliding member of the securing structure being mounted to the server.
Figure 8:
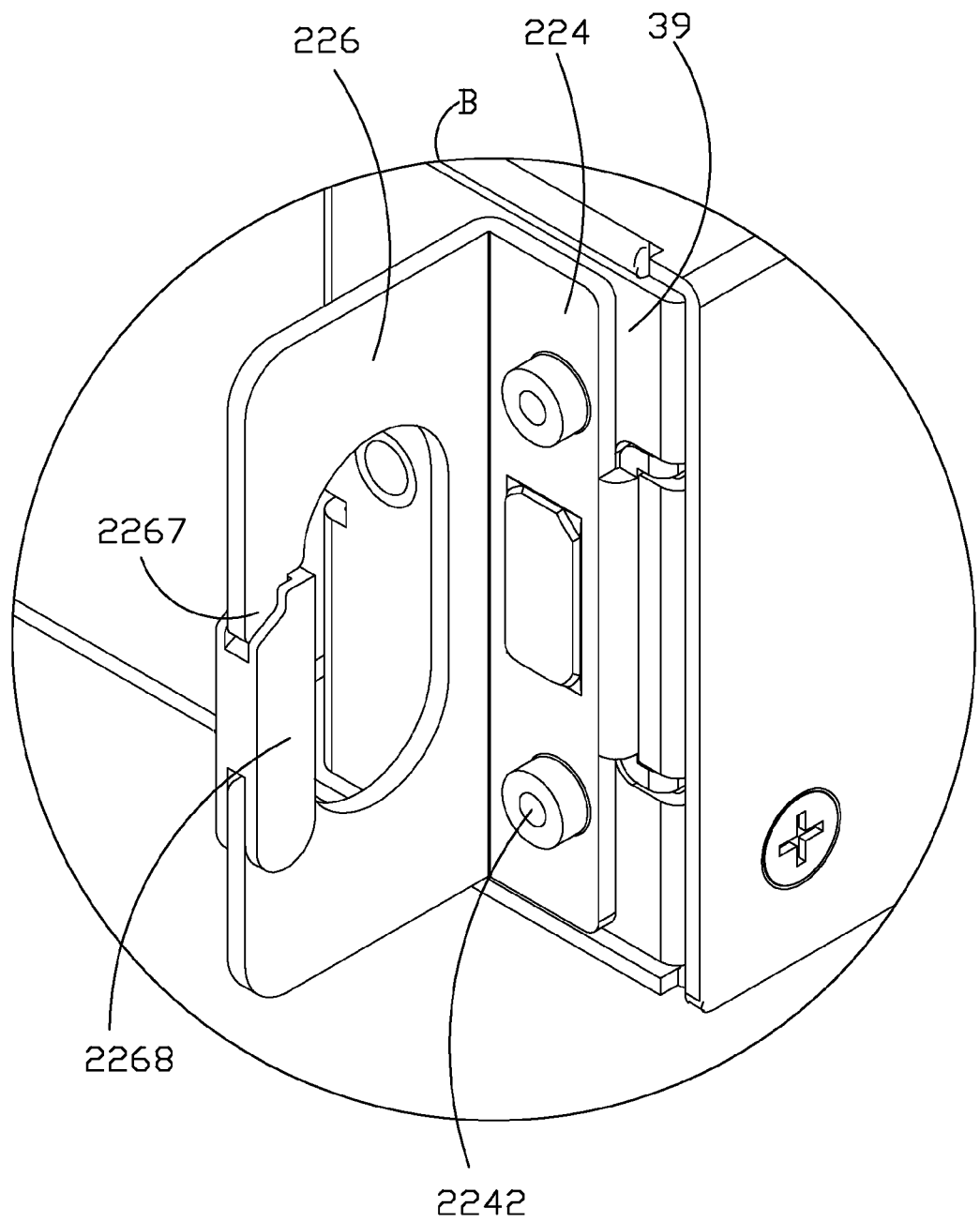
FIG. 8 is an enlarged view of an area labeled B in FIG. 7.

The fixing portion 224 defines a recessed portion 2244 and a magnet 2246 fixed to the recessed portion 2244. The housing 32 is fabricated from metal material. Referring to FIGS. 7-8, when the fixing portion 224 makes contact with the housing 32, the fixing portion 224 is secured to the housing 32 by a magnetic force between the magnet 2246 and the housing 32. In this embodiment, the fixing portion 224 is perpendicular to the sliding portion 222, the housing 32 comprises a fixing plate 39 perpendicular to the sidewall 34, and when the fixing portion 224 is secured to the housing 32, the fixing portion 224 snugly contacts with the fixing plate 39.

Referring to FIGS. 4-5 and 9-10, the receiving portion 226 defines a receiving room 2262 and an opening 2264 configured at one side of the receiving room 2262 away from the fixing portion 224 and communicating the receiving room 2262 with an exterior of the receiving portion 226. The at least one cable 50 passes through the opening 2264 to be received in the receiving room 2262. The receiving portion 226 comprises a body plate 2261 and a stopper element 2268. The receiving room 2262 and the opening 2264 are defined in the body plate 2261. The stopper element 2268 is pivotably mounted to the body plate 2261 and located at the opening 2264. The body plate 2261 comprises a pivoting portion 2266 and a limiting portion 2267 respectively located at two opposite sides of the opening 2264. One end of the stopper element 2268 is pivotably mounted to the pivoting portion 2266, and the other end of the stopper element 2268 is stopped in the receiving room 2262 by the limiting portion 2267. The stopper element 2268 can rotate relatively to the body plate 2261 to be received in the receiving room 2262, thereby providing an entrance for the cable 50 being inserted into the receiving room 2262. The limiting portion 2267 engages with the stopper element 2268 to cooperatively cover the opening 2264

In this embodiment, the body plate 2261 is parallel with the sliding portion 222 and perpendicular to the fixing portion 224.

Although features and elements of the present embodiments are described in particular combinations, each feature or element can be used alone or in other combinations within the principles of the present disclosure to the full extent indicated by the broad general meaning of the terms in which the appended claims are expressed.

What is claimed is:

1. A securing structure used to mount a server to a server cabinet, the server comprising a housing, the securing structure comprising:
a sliding member, comprising a sliding portion, a receiving portion, and a fixing portion configured between the sliding portion and the receiving portion, the sliding portion extending into the housing and slidably connected to a sidewall of the housing, the receiving portion used to receive at least one cable connected to the server; and
a fixing member, securely connected between the fixing portion and the server cabinet.

2. The securing structure of claim 1, wherein the housing defines a through hole formed at one end of the sidewall, the sidewall comprises a guiding portion and a positioning portion, the sliding portion of the sliding member defines a sliding groove, the sliding portion matches with the guiding portion, and the sliding groove matches with the positioning portion, to slidably position the securing structure to the sidewall.

3. The securing structure of claim 2, wherein the positioning portion is configured between the guiding portion and the through hole, and comprises a fixing post protruding inwardly from the sidewall and a screw comprising a post portion passing through the sliding groove and screwed into the fixing post and a head portion secured on an opposite side of the sliding portion away from the sidewall.

4. The securing structure of claim 2, wherein the sliding portion comprises an inclined portion configured on a free end of the sliding portion away from the fixing portion, the inclined portion has a smaller size relative to the through hole, thereby providing an easy installation between the securing structure and the housing.

5. The securing structure of claim 1, wherein the fixing portion defines a recessed portion and a magnet fixed to the recessed portion, when the fixing portion contacts with the housing, the fixing portion is secured to the housing by a magnetic force between the magnet and the housing.

6. The securing structure of claim 5, wherein the fixing portion is perpendicular to the sliding portion, the housing comprises a fixing plate perpendicular to the sidewall, when the fixing portion is secured to the housing, the fixing portion snugly contacts with the fixing plate.

7. The securing structure of claim 1, wherein the receiving portion defines a receiving room and an opening configured at one side of the receiving room away from the fixing portion and communicating the receiving room with an exterior of the receiving portion, the at least one cable passes through the opening to be received in the receiving room.

8. The securing structure of claim 7, wherein the receiving portion comprises a body plate, in which the receiving room and the opening are defined, and a stopper element pivotably mounted to the body plate and located at the opening.

9. The securing structure of claim 8, wherein the body plate comprises a pivoting portion and a limiting portion respectively located two opposite sides of the opening, one end of the stopper element is pivotably mounted to the pivoting portion, and the other end of the stopper element is stopped in the receiving room by the limiting portion.

10. The securing structure of claim 8, wherein the body plate is parallel with the sliding portion and perpendicular to the fixing portion.

11. A server comprising a housing and a securing structure slidably connected to the housing and used to mount the server to a server cabinet, the securing structure comprising:
a sliding member, comprising a sliding portion, a receiving portion and a fixing portion configured between the sliding portion and the receiving portion, the sliding portion extending into the housing and slidably connected to a sidewall of the housing, the receiving portion used to receive at least one cable connected to the server; and
a fixing member, securely connected between the fixing portion and the server cabinet.

12. The server of claim 11, wherein the housing defines a through hole formed at one end of the sidewall, the sidewall comprises a guiding portion and a positioning portion, the sliding portion of the sliding member defines a sliding groove, the sliding portion matches with the guiding portion, and the sliding groove matches with the positioning portion, to slidably position the securing structure to the sidewall.

13. The server of claim 12, wherein the positioning portion is configured between the guiding portion and the through hole, and comprises a fixing post protruding inwardly from the sidewall and a screw comprising a post portion passing through the sliding groove and screwed into the fixing post and a head portion secured on an opposite side of the sliding portion away from the sidewall.

14. The server of claim 12, wherein the sliding portion comprises an inclined portion configured on a free end of the sliding portion away from the fixing portion, the inclined portion has a smaller size relative to the through hole, thereby providing an easy installation between the securing structure and the housing.

15. The server of claim 11, wherein the fixing portion defines a recessed portion and a magnet fixed to the recessed portion, when the fixing portion contacts with the housing, the fixing portion is secured to the housing by a magnetic force between the magnet and the housing.

16. The server of claim 15, wherein the fixing portion is perpendicular to the sliding portion, the housing comprises a fixing plate perpendicular to the sidewall, when the fixing portion is secured to the housing, the fixing portion snugly contacts with the fixing plate.

17. The server of claim 10, wherein the receiving portion defines a receiving room and an opening configured at one side of the receiving room away from the fixing portion and communicating the receiving room with an exterior of the receiving portion, the at least one cable passes through the opening to be received in the receiving room.

18. The server of claim 17, wherein the receiving portion comprises a body plate, in which the receiving room and the opening are defined, and a stopper element pivotably mounted to the body plate and located at the opening.

19. The server of claim 18, wherein the body plate comprises a pivoting portion and a limiting portion respectively located two opposite sides of the opening, one end of the stopper element is pivotably mounted to the pivoting portion, and the other end of the stopper element is stopped in the receiving room by the limiting portion.

20. The server of claim 18, wherein the body plate is parallel with the sliding portion and perpendicular to the fixing portion.

* * * * *